US006792020B2

United States Patent
Romm

(10) Patent No.: US 6,792,020 B2
(45) Date of Patent: Sep. 14, 2004

(54) LASER DRIVER WITH A SAFETY CIRCUIT HAVING DIGITAL FEEDBACK

(75) Inventor: Gideon Z. Romm, Bronx, NY (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/213,560

(22) Filed: Aug. 5, 2002

(65) Prior Publication Data

US 2004/0022285 A1 Feb. 5, 2004

(51) Int. Cl.$^7$ ................................................ H01S 3/00
(52) U.S. Cl. ............................... 372/38.09; 372/38.02; 372/38.07
(58) Field of Search ................................ 372/38.02, 38.07, 372/38.09

(56) References Cited

U.S. PATENT DOCUMENTS 5,019,769 A    5/1991   Levinson ...................... 372/31
5,309,461 A *  5/1994   Call et al. ................. 372/38.09
5,999,549 A * 12/1999   Freitag et al. ............ 372/38.09

* cited by examiner

Primary Examiner—Don Wong
Assistant Examiner—James Menefee

(57) ABSTRACT

A driver circuit for an opto-electrical transmitter includes a digital feedback loop. A counter in the feedback loop maintains a count that controls a bias current output to the opto-electrical transmitter. A first fault activation circuit in the driver activates a fault signal that disables the driver when the count causes an overflow or underflow. The overflow/underflow can correspond to the input range of an ADC that converts the count into an analog signal to an output amplifier or to the range of the counter. A second fault activation signal times the duration of any periods during which a digital parameter of the driver is outside a target range. The digital parameter can be e a measured monitor current or the count that controls the output amplifier.

23 Claims, 3 Drawing Sheets

LASER DRIVER WITH A SAFETY CIRCUIT HAVING DIGITAL FEEDBACK

BACKGROUND

A primary concern for an opto-electrical transmitter such as a vertical cavity surface emitting laser (VCSEL) is control of the light intensity entering an optical fiber from the opto-electrical transmitter. A driver for the opto-electrical transmitter typically controls a drive current to the opto-electrical transmitter to control the emitted light intensity. The drive current generally has a level set according to a data signal and the performance characteristics of the opto-electrical transmitter, but for safety, the driver current should be limited so that the light intensity entering the optical fiber does not exceed eye safety levels.

FIG. 1 shows a conventional driver 100 that controls the output power level of a transmitter 110. As illustrated in FIG. 1, driver 100 provides a current having two components Ibias and Imod. Current Imod is modulated between 0 and a maximum current IMOD according to the logic value of a data signal DATA and maintains an average value of IMOD/2 under normal operating conditions. Current Ibias controls the current level for a logic value 0 (i.e., when Imod=0) and contributes to the average current level (Ibias+IMOD/2), which controls the average emitted light intensity and has a level controlled by an analog feedback loop in driver 100.

For the feedback loop, driver 100 includes a monitor diode 120, an amplifier 130, and a current source 140. Monitor diode 120 is a photodiode that generates a voltage Vmon according to an intercepted portion of the light emitted from transmitter 110. Monitor diode 120 is a slow device (relative to variations in a data signal DATA) so that voltage Vmon is directly related to the average intensity of the light emitted from transmitter 110. Alternatively, monitor diode 120 could comprise a "fast" device with the addition of a low-pass-filter such that Vmon is related to the average intensity of the light emitted from transmitter 110.

Amplifier 130 is a differential amplifier having a negative input terminal coupled to monitor diode 120, a positive terminal connected to receive a reference voltage REF, and an output terminal coupled to control the bias current Ibias through current source 140. Accordingly, amplifier 130 is in a feedback loop that limits the average intensity of light emitted from transmitter 110. In particular, when the light intensity increases, monitor voltage Vmon increases causing amplifier 130 to reduce bias voltage Vbias and causing current source 140 to reduce bias current Ibias. When the light intensity decreases, monitor voltage Vmon decreases causing amplifier 130 to increase bias voltage Vbias and causing current source 140 to increase bias current Ibias.

The feedback loop drives bias current Ibias towards an equilibrium level that depends on reference voltage REF. In turn, the average intensity of emitted light depends on the current Ibias+IMOD/2 and the performance of transmitter 110 in converting current to emitted light. In the embodiment of FIG. 1, a calibration process for transmitter 110 selects the resistance of a resistor 132 and thereby selects reference voltage REF according to the performance of transmitter 110 and monitor diode 120. The setting of the resistance 132 compensates for permanent or structural variations between opto-electrical transmitters such as a variation in VCSEL efficiency and the feedback loop can compensate for temporary variations in the operation of transmitter 110.

Driver 100 also requires a mechanism to shut down transmitter 110 in the event of a permanent unsafe condition. A permanent unsafe condition can arise, for example, when a short in monitor diode 120 to ground causes the feedback loop to increase the drive current so that the average emitted intensity remains above the eye safety level.

Driver 100 includes a mechanism to shut down transmitter 110 if monitor voltage Vmon rises to a level indicating that the output power of light from transmitter 110 is unsafe. In particular, a differential amplifier 150 compares monitor voltage Vmon to a maximum voltage MAX. A resistor 152 has a resistance selected to set maximum voltage MAX at the appropriate level according to the fraction of the light monitor diode 120 receives and an eye safety level for the total intensity. If monitor voltage Vmon rises above maximum voltage MAX, the output voltage from amplifier 150 sets a latch 154, which in turn shuts off the currents Imod and Ibias via switches 160 and 161 such that no current flows to transmitter 110.

A disadvantage of driver 100 is that driver 100 shuts down and becomes inoperable as soon as the voltage Vmon from monitor diode 120 rises above voltage MAX. However, if the unsafe condition is transient, e.g., if transmitter 100 is functioning properly but some external transient effect caused the laser power to temporarily rise above the eye safety level, driver 100 shuts down, breaking any communication link through transmitter 110. Generally, it would be desirable not to assert a fault signal so that the communication link can remain intact, as a transient high light-output-level is eye-safe as long as the transient time is short.

Another disadvantage of driver 100 is the requirement of analog components such as resistors 132 and 152 that must be calibrated according to the specific performance of transmitter 110. The analog components are difficult to fabricate in a small device package. Additionally, the analog time constant may make such analog circuits unable to meet all timing requirements.

A digital system can overcome many of the drawbacks of analog drive circuits. U.S. pat. No. 5,019,769 describes a digital laser drive system that uses a digital data processor. While this digital system avoids many of the drawbacks of analog drivers, the requirement of a digital data processor increases the complexity and cost of the driver. Accordingly, a digital driver circuit is sought that avoids the drawbacks of analog driver circuits and distinguishes between permanent and temporary unsafe conditions but does not require the cost or complexity of a digital data processor.

SUMMARY

In accordance with an aspect of the invention, an opto-electrical transmitter such as a VCSEL has a driver with a digital feedback loop and digital fault detection. The fault detection allows the driver and opto-electrical transmitter to continue operating in the event where the average light intensity exceeds the maximum eye-safe level allowable for continuous exposure. Henceforth, this maximum allowed continuous exposure level will be referred to as CESL, for continuous emission safe level. The digital feedback loop includes an up/down counter having an output count that controls the bias current for the opto-electrical transmitter. In response to a clock signal, the counter counts up or down if a monitor current from a monitor diode indicates the average emitted light intensity is less than or greater than a desired intensity. If the count reaches a maximum (overflow) or minimum (underflow) value, a fault condition is detected.

Additional fault detection circuitry in the driver includes a second counter. The second counter counts up if the monitor current indicates the average power of the emitted light is outside a target range and counts down or resets if the monitor current indicates the average emitted light intensity is in the target range. If the count from the second counter reaches a trigger level a fault is detected. Accordingly, if the laser power temporarily exceeds the CESL but returns to a level below the CESL before the second count reaches the fault trigger, the fault signal is not activated and the driver can continue to operate. But, if the laser power is persistently outside the CESL, the second count will reach the fault threshold, and the fault signal is activated.

One specific embodiment of the invention is a driver circuit for an opto-electrical transmitter. The driver circuit includes a monitor diode, a counter, an output driver, and a fault activation circuit. The counter is connected in a feedback loop with the monitor diode and the output driver. In particular, the counter counts up or down depending on the power output that the monitor diode measures for the opto-electrical transmitter, and the output driver provides to the opto-electrical transmitter a bias current at a level depending on a count from the counter. The fault activation circuit is connected to activate a fault signal in response to the count from the counter reaching a trigger value. The trigger value can be a value that overflows or underflows the counter or a value that overflows or underflows the input range of a digital-to-analog converter that converts the count to a control signal for the output driver.

Another embodiment of the invention is also a driver circuit for an opto-electrical transmitter. This embodiment includes a counter, a comparator circuit, and a fault activation circuit. The comparator circuit provides an enable signal and a reset signal to the counter. For example, the comparator circuit enables the counter in response to a digital parameter of the driver circuit being outside a target range and resets the counter when the digital parameter is in the target range. The fault activation circuit activates a fault signal that disables operation of the driver circuit in response to a count in the counter reaching a trigger value. Accordingly, the counter times the duration of each interval that the digital parameter is outside the target range. The digital parameter can be a parameter that controls a bias current output from the driver circuit to the opto-electrical transmitter or a parameter that corresponds to power that a monitor diode measures for the output of the opto-electrical transmitter. A memory can store high and low margin values that the comparator circuit uses when determining whether the digital parameter is in the target range. Accordingly, the target range is easily programmable according to the performance of an opto-electrical transmitter.

Optionally, this embodiment of the invention further includes a digital-to-analog converter that converts the digital parameter into an analog voltage that controls the bias current output from the driver circuit. In such an embodiment, a second fault activation circuit can activate the fault signal in response to the digital parameter being outside a range of proper input values for the digital-to-analog converter.

Another variation of this embodiment further includes a monitor diode and a second counter. The second counter has the digital parameter as a count value and is connected so that the second counter counts up or down depending on a value from the monitor diode indicating the power output from the opto-electrical transmitter. A second fault activation circuit activates the fault signal in response to the digital parameter being outside a second range. The second range can extend between the limits of proper input values for a digital-to-analog converter that converts the digital parameter into an analog voltage for control of the bias current output from the driver circuit or between the overflow and underflow values of the second counter.

Yet another embodiment of the invention is a method for controlling operation of a drive circuit for an opto-electrical transmitter. This method includes timing a period during which a digital operating parameter of the drive circuit is outside a target range, and activating a fault signal in response to the period extending beyond a maximum period. Timing the period can be conducted by determining whether the digital operating parameter of the drive circuit is within the target range and incrementing a counter in synchronization with a clock signal as long as the digital operating parameter is outside the target range. Generally, the counter is reset when the digital operating parameter is within the target range, and the fault signal is activated if the count reaches a trigger value corresponding to the maximum period. The digital parameter can be a value that controls a bias current output from the driver circuit to the opto-electrical transmitter or a value that corresponds to power measured for light output of the opto-electrical transmitter.

BRIEF DESCRIPTION OF THE DRAWINGS

Use of the same reference symbols in different figures indicates similar or identical items.

DETAILED DESCRIPTION

Figure 1:
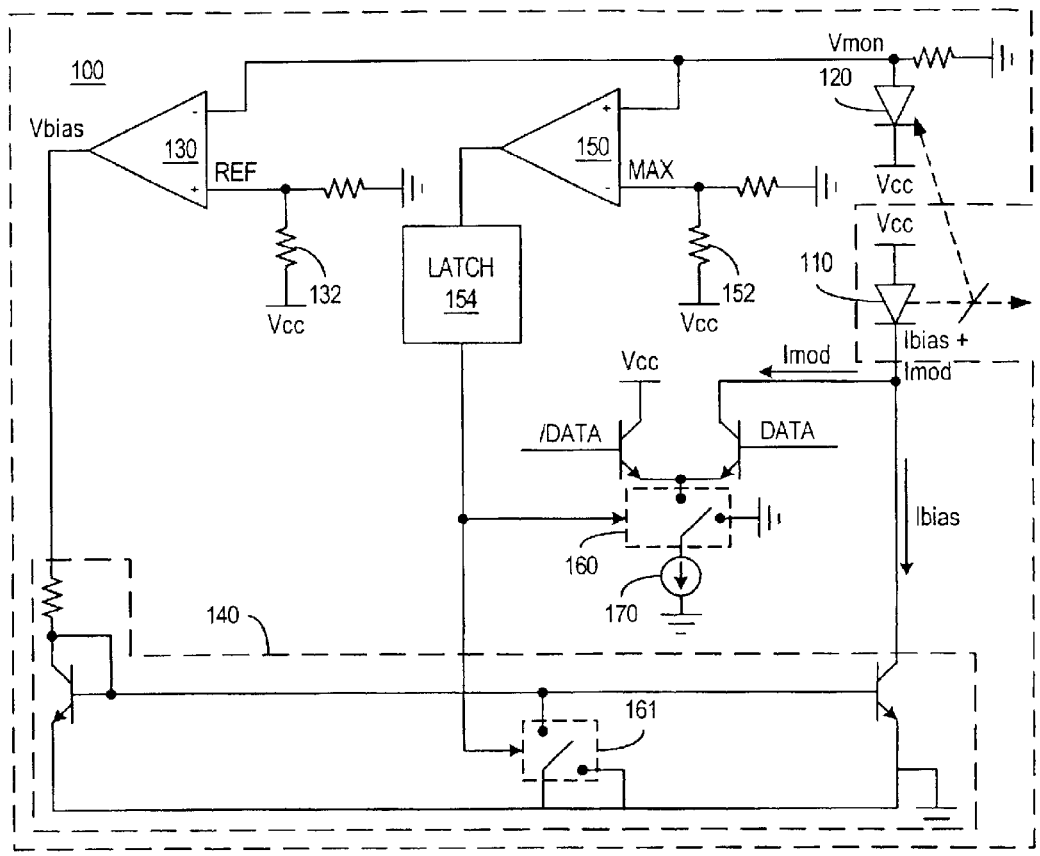
FIG. 1 is a block diagram of a conventional analog driver circuit for an opto-electrical transmitter.
Figure 2:
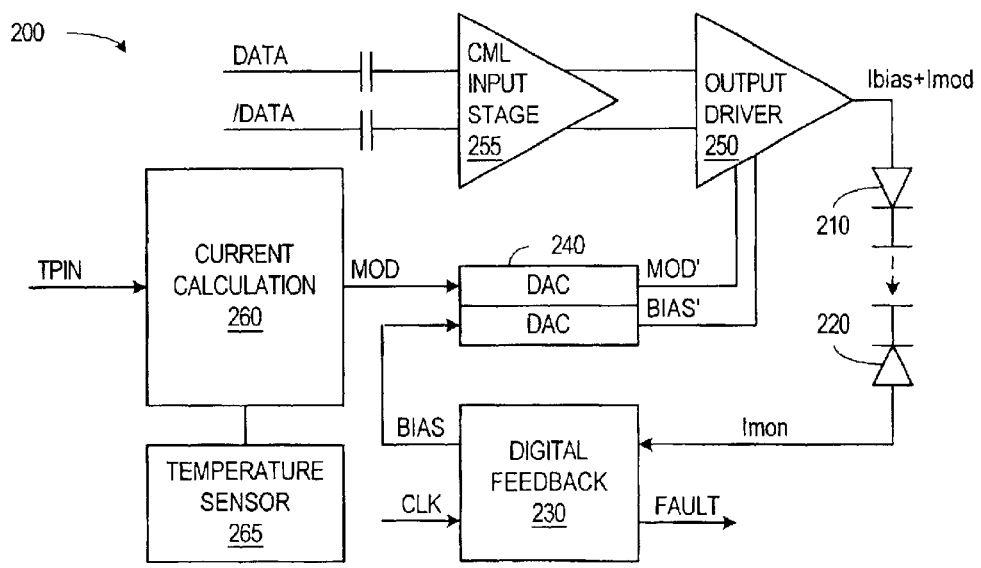
FIG. 2 is a block diagram of a digital driver circuit in accordance with an embodiment of the invention.

A driver circuit uses a digital feedback loop and digital fault detection for operation of an opto-electrical transmitter such as a VCSEL. FIG. 2 is a block diagram of a system 200 in accordance with an embodiment of the invention. System 200 includes an opto-electrical transmitter 210, a monitor diode 220, a digital feedback circuit 230, digital-to-analog converters (DACs) 240, an output driver 250, and a current calculation block 260.

In an exemplary embodiment of the invention, opto-electrical transmitter 210 is a conventional vertical cavity surface emitting laser (VCSEL) that emits a light beam having an intensity that depends on the magnitude of a drive current from output driver 250. However, other embodiments of the invention can drive other opto-electrical transmitters such as an LED (Light Emitting Diode) or a Fabry-Perot Laser. The magnitude of the drive current from output driver 250 depends on analog signals BIAS' and MOD' and on data signals from a conventional CML level input stage 255. Signal BIAS' controls the magnitude of a bias current Ibias for transmitter 210. Signal MOD' controls a gain of output driver 250 or the amplitude of current Imod which changes in response to the data signals. The light emitted from transmitter 210 has an intensity that depends on the output current Ibias+Imod from output driver 250.

Monitor diode 220, which receives a portion of the emitted light from transmitter 210, is a conventional photodiode and generates a current Imon that is proportional or otherwise directly related to the average intensity of the light monitor diode 220 receives from transmitter 210.

Digital feedback circuit 230, which is synchronized with a clock signal CLK, receives monitor current Imon from monitor diode 220. During each clock cycle, digital feedback circuit 230 converts monitor current Imon into a digital value proportional to the magnitude of monitor current Imon, compares the measured digital value to a reference value, and adjusts a digital value BIAS according to the magnitude of current Imon. DAC 240 converts digital value BIAS into the analog signal BIAS', which controls the bias current Ibias that output driver 250 supplies to transmitter 210. In addition to controlling the bias current Ibias, digital feedback circuit 230 also detects error or fault conditions of transmitter 210 and activates a signal FAULT to indicate the presence of a fault and to stop further operation of transmitter 210.

Current calculation block 260 receives a temperature value from a temperature sensor 265 and adjusts the operating parameters such as the gain MOD of output driver 250 to compensate for the effects of temperature on transmitter 210 and the rest of system 200.

Figure 3A:
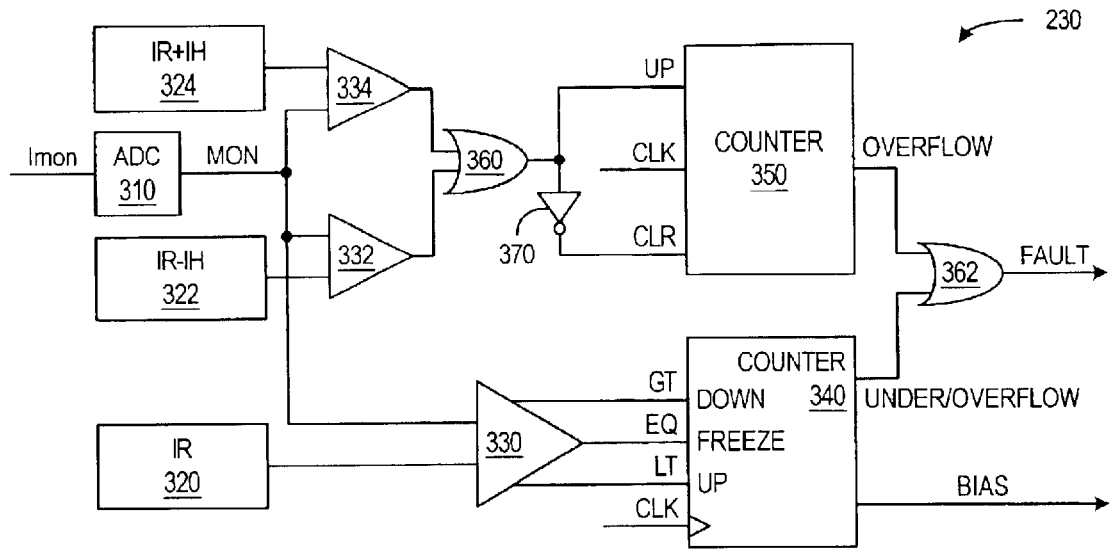
FIGS. 3A and 3B are block diagrams of digital feedback loops with digital fault detection in accordance with alternative embodiments of the invention.

FIG. 3A is a block diagram of an exemplary embodiment of digital feedback circuit 230. In the embodiment of FIG. 3A, feedback loop 230 includes an analog-to-digital converter (ADC) 310, digital comparators 330, 332, 334, OR gates 360 and 362, an inverter 370, and counters 340 and 350. During each period of a clock signal CLK, ADC 310 samples monitor current Imon and generates a digital signal MON indicating the magnitude of monitor current Imon during that period.

For control of bias current Ibias, comparator 330 compares digital value MON to a reference value IR and activates a signal GT, EQ, or LT if the value of signal MON is greater than, equal to, or less than reference value IR. When the value of signal MON is greater than reference value IR, comparator 330 activates signal GT, which causes counter 340 to count down and thereby decreases the value BIAS, reducing the voltage of analog signal BIAS' and the bias current bias. When the value of signal MON is less than reference value IR, comparator 330 activates signal LT, which causes counter 340 to count up, increasing the value of signal BIAS, the voltage of signal BIAS', and the bias current Ibias. When the measured value MON is equal to reference value IR, comparator 330 activates signal EQ, which freezes counter 340 and maintains the value BIAS, the voltage of signal BIAS', and the bias current Ibias. Accordingly, the feedback loop including digital feedback 230 drives the digital value BIAS (and the resulting bias current Ibias) to a level corresponding to digital reference value IR.

Reference value IR can be stored in volatile or non-volatile memory that can be embedded in the integrated circuit containing system 200 or can be an external memory circuit. Integrated circuit packaging can thus be kept small, even for an integrated circuit containing many opto-electrical transmitters, because separately tunable resistors are not required for each transmitter. Additionally, calibration of bias current Ibias simply involves writing to memory and is easily changed if necessary as transmitter 210 and monitor diode 220 age.

A fault detection mechanism in digital feedback circuit 230 identifies a fault condition when count value BIAS in counter 340 increases to overflow the capacity of counter 340 or decreases to underflow the capacity of counter 340. Accordingly, the maximum delay before asserting a fault signal FAULT in response to a defect that causes value BIAS to steadily increase or decrease is equal to the product of the range of counter 340 and the period of clock signal CLK. Alternatively, comparators (not shown) can be used to determine whether count BIAS in counter 340 reaches any value F1. The fault value F1 can be stored in memory and modified if a change in the fault conditions is desired.

Figure 3B:
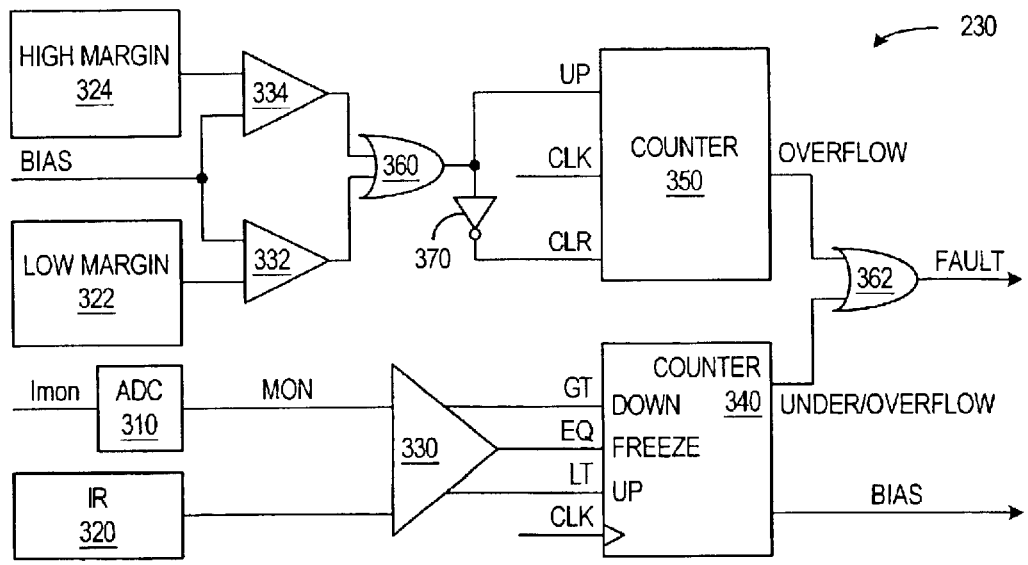

Another fault detection mechanism in digital feedback circuit 230 uses counter 350. Counter 350 effectively counts the number of clock periods during which an operating parameter of the system indicates the emitted power is outside a target range. For example, to satisfy typical industry fault timing expectations when the light from transmitter 210 is directed into a multi-mode fiber, the maximum counter value and the frequency of clock signal CLK causes counter 350 to overflow after about 100 $\mu$s during which value MON indicates the light intensity remained above the CESL (currently about −1 dBm). In FIG. 3A, monitor current value MON is the operating parameter examined to detect a fault, but an alternative or additional fault detection circuit can examine other operating parameters such as bias value BIAS to determine whether the light intensity is within the target range. FIG. 3B illustrates an alternative embodiment of digital feedback circuit 230 that detects a fault if bias value BIAS remains outside a target range for an extended period.

In the embodiment of FIG. 3A, which performs fault detection based on the monitor current MON, the target range has high and low margins IR+IH and IR−IH. High margin IR+IH can but is not required to correspond to the eye safety level for the emitted intensity, CESL. Level IR+IH and IR−IH would typically be set to within a few percent of IR to provide a fault signal if precise control of the laser is not achieved or to detect other faults such as a short from the monitor PIN to ground. Adders (not shown) can generate the margins IR−IH and IR+IH from the stored value of IR, and comparators 332 and 334 compare monitor value MON to margin values IR−IH and IR+IH, respectively. Alternatively, high and low margins that are independent of value IR can be stored in memory or registers 322 and 324 and compared to monitor value MON or any other digital operating parameter of the system.

If the magnitude of monitor current Imon as reflected by signal MON is outside the target range, e.g., above high margin IR+IH or below low margin IR−IH, an output signal from comparator 332 or 334 activates a signal UP causing counter 350 to count up in response to clock signal CLK. If the magnitude of monitor current Imon as reflected by signal MON is within the target range, output signals from comparators 332 and 334 activate a signal CLR clearing or resetting counter 350. OR gate 360 and inverter 370 provide the necessary logic interface between comparators 332 and 334 and counter 350 to achieve the described behavior. If the emitted light power remains above (or below) the target range for a sufficient time (e.g., 100 $\mu$s), counter 350 will count up until overflowing its capacity and thereby cause activation of fault signal FAULT.

In an alternative embodiment, a comparator (not shown) compares the time count in counter 350 to a programmable level F2 and activates the fault signal FAULT if the count is greater than or equal to level F2.

Figure 4:
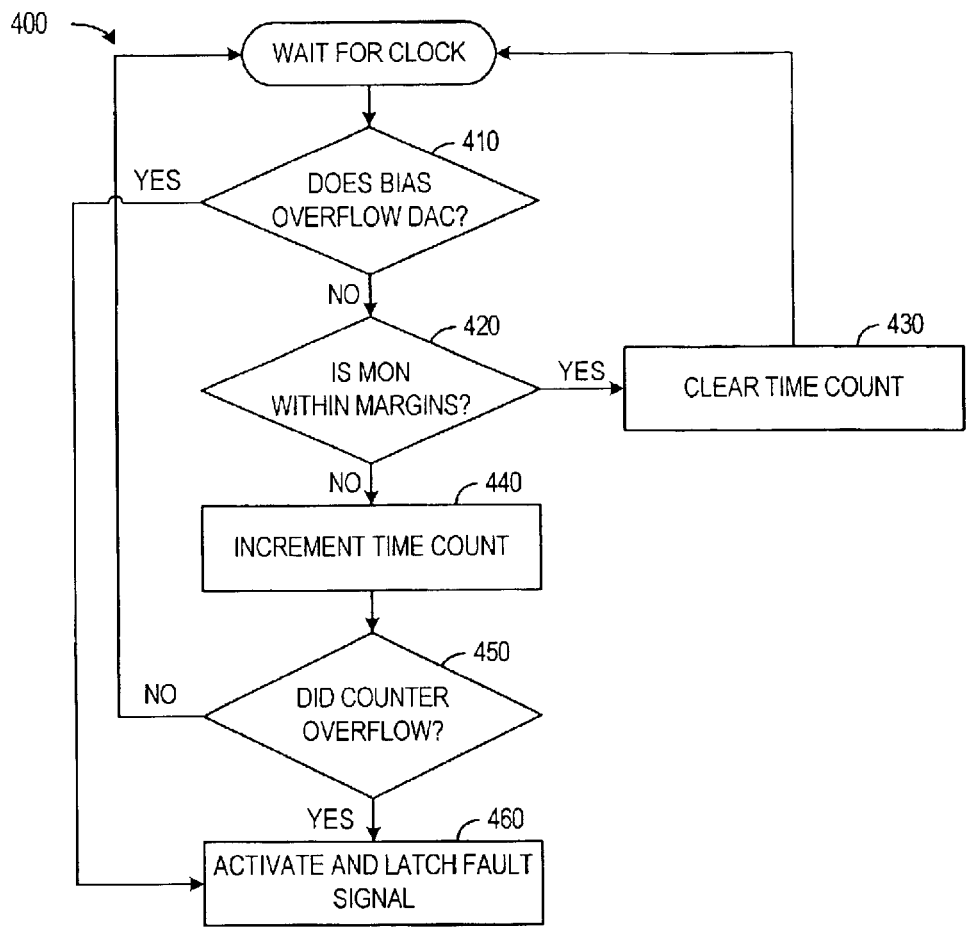
FIG. 4 is a flow diagram of a fault detection process in accordance with an embodiment of the invention.

FIG. 4 is a flow diagram of a fault detection process 400 implemented in digital feedback circuit 230 of FIG. 3A. In process 400, step 410 determines whether digital value BIAS overflows or underflows the range of counter 340 or the range of DAC 240 (FIG. 2). If value BIAS is too large or too small, counter 340 activates signal OVERFLOW/ UNDERFLOW, and the fault signal is activated and latched in step 460.

If value BIAS is in an acceptable range, comparators 332 and 334 (in step 420) determine whether monitor current value MON is within the target range IR−IH to IR+IH. If monitor current value MON is within the target range, counter 350 is cleared in step 430. If monitor current value MON is not within the target range, step 440 increments the time count in counter 350, and step 450 determines whether incrementing caused counter 350 to overflow. If counter 350 did overflow, the fault signal is activated and latched in step 460.

If counter 350 is cleared or did not overflow, process 400 branches from step 430 or 450 to wait for the clock signal before beginning again at step 410.

Figure 5:
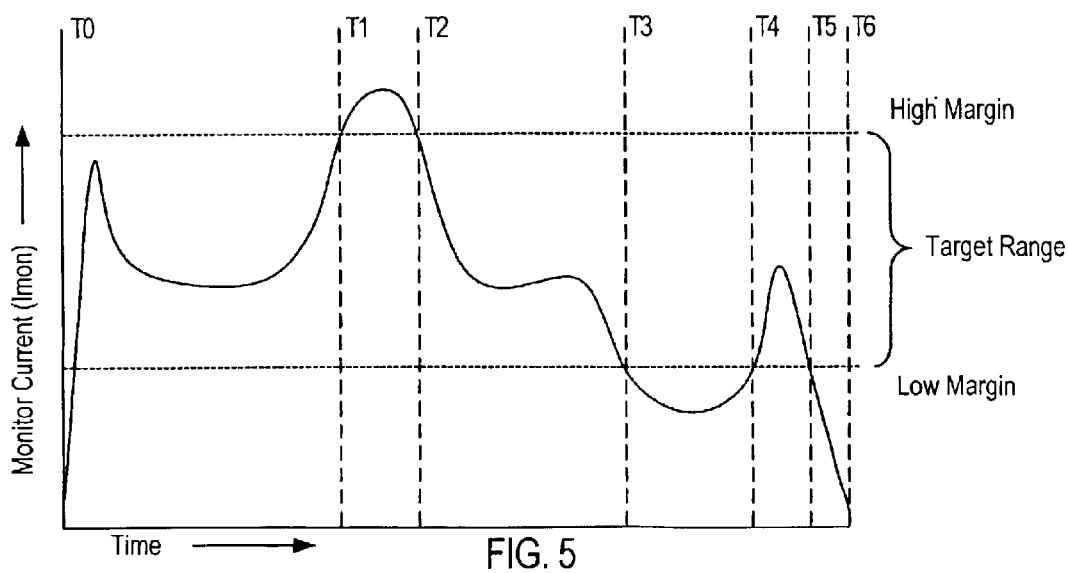
FIG. 5 illustrates bias current levels for a system reaching a fault state.

FIG. 5 is a graph of the monitor current value MON verses time illustrating how driver circuit 200 with digital feedback circuit 230 handles temporary and permanent fault conditions. The monitor current MON illustrated in FIG. 5 remains within a target range from a time T0 to a time T1, but at time T1, monitor current MON exceeds the high margin IR+IH, and counter 350 begins incrementing a time count. At time T2, the monitor current returns to the target range, and counter 350 resets the time count avoiding activation of the fault signal. A temporary condition with light intensity above the CESL thus occurred between times T1 and T2, but the driver continued to operate, for example, to maintain a communication link on an optical fiber.

During the interval between times T2 and T3, monitor current value MON remains within the target range, but falls below the low margin at time T3. Again, counter 350 begins counting the number of clock cycles that the monitor current remains below the low margin IR−IH. At time T4, the monitor current returns to target range, and counter 350 resets before the fault signal is activated.

At time T5, the monitor current again falls below the low margin, and counter 350 begins counting. At time T6, drive current BIAS falls to the minimum limit of the DAC 240 that converts drive current value BIAS, and the fault signal is activated and latched to stop further operation. If the bias value BIAS did not reach the minimum limit of DAC 240 but monitor current value MON continued below the low margin IR−IH, counter 350 would cause activation of the fault signal only after the value MON remained outside the target range for a period too long to be considered temporary. Accordingly, the driver circuit as described above can keep a transmitter operating through temporary conditions but disables operation if an undesired operation condition continues for an extended period or becomes extreme.

Although the invention has been described with reference to particular embodiments, the description is only an example of the invention's application and should not be taken as a limitation . Various adaptations and combinations of features of the embodiments disclosed are within the scope of the invention as defined by the following claims.

What is claimed is:

1. A driver circuit for an opto-electrical transmitter, comprising:
   a monitor diode;
   a counter connected to the monitor diode so that the counter counts up or down depending on a first value from the monitor diode indicating power output from the opto-electrical transmitter;
   an output driver coupled to the counter and providing to the opto-electrical transmitter a bias current for operation of the opto-electrical transmitter, wherein a count in the counter controls which of a plurality of non-zero levels of the bias current is used during transmissions by the opto-electrical transmitter; and
   a fault activation circuit that activates a fault signal in response to the count from the counter reaching a second value.

2. The driver circuit of claim 1, wherein the second value overflows the counter.

3. The driver circuit of claim 1, wherein the second value underflows the counter.

4. The driver of claim 1, further comprising a digital-to-analog converter connected to convert the count in the counter to an analog signal that controls the bias current from the output driver, wherein the fault signal is activated in response to the second value overflowing a range of input values of the digital-to-analog converter.

5. The driver of claim 1, further comprising:
   an analog-to-digital converter connected to convert a current from the monitor diode into the first value;
   a memory storing a second value; and
   a comparator connected to the analog-to-digital converter, the memory, and the counter, wherein an output signal from the comparator that indicates a relation between the first and second values controls whether the counter counts up or down.

6. The driver of claim 5, wherein the second value is stored in the memory during a calibration process.

7. A driver circuit for an opto-electrical transmitter, comprising:
   a first counter;
   a comparator circuit connected to provide an enable signal and a reset signal to the first counter, the comparator circuit activating the enable signal in response to a digital parameter of the driver circuit being outside a target range; and
   a first fault activation circuit coupled to the first counter, the fault activation circuit activating a fault signal that disables operation of the driver circuit in response to a count in the first counter reaching a trigger value.

8. The circuit of claim 7, wherein the digital parameter is a value that corresponds to power that a monitor diode measures from the output of the opto-electrical transmitter.

9. The circuit of claim 8, further comprising:
   a monitor diode and a converter connected to supply the digital parameter to the comparator circuit; and
   a second counter connected such that the second counter counts up or down depending on a value from the monitor diode indicating the power output from the opto-electrical transmitter, wherein the second counter supplies a count that controls a bias current output from the driver circuit to the opto-electrical transmitter.

10. The circuit of claim 9, further comprising a second fault activation circuit that activates the fault signal in response to the count from the second counter reaching a trigger value.

11. The circuit of claim 7, wherein the digital parameter is a value that controls a bias current output from the driver circuit to the opto-electrical transmitter.

12. The circuit of claim 11, further comprising:
   a digital-to-analog converter that converts the digital parameter into an analog voltage that controls the bias current output from the driver circuit; and
   a second fault activation circuit that activates the fault signal in response to the digital parameter being outside a range of proper input values for the digital-to-analog converter.

13. The circuit of claim 11, further comprising:
a monitor diode; and
a second counter having the digital parameter as a count value, the second counter being connected to the monitor diode so that the second counter counts up or down depending on a value from the monitor diode indicating the power output from the opto-electrical transmitter, wherein the fault activation circuit activates the fault signal in response to the digital parameter overflowing or underflowing the second counter.

14. The circuit of claim 7, wherein the comparator circuit activates the reset signal in response to the digital parameter of the driver circuit being within the target range.

15. A method for controlling operation of a drive circuit for an opto-electrical transmitter, comprising:
timing a period during which a multi-bit digital operating parameter of the drive circuit is outside a target range; and
activating a fault signal in response to the period extending beyond a maximum period.

16. The method of claim 15, wherein timing the period comprises:
determining whether the digital operating parameter of the drive circuit is within the target range; and
incrementing a counter in synchronization with a clock signal as long as the digital operating parameter is outside the target range.

17. The method of claim 16, further comprising resetting the counter when the digital operating parameter is within the target range.

18. The method of claim 16, wherein activating the fault signal is in response to the count in the counter reaching a trigger value corresponding to the maximum period.

19. The method of claim 16, wherein the digital parameter is a multi-bit value that controls a bias current output from the driver circuit to the opto-electrical transmitter.

20. The method of claim 16, wherein the digital parameter is a multi-bit value that corresponds to a power level measured for light output from the opto-electrical transmitter.

21. A driver circuit for an opto-electrical transmitter, comprising:
an output driver that provides a bias current for operation of the opto-electrical transmitter;
a monitor diode that generates an analog signal indicating power output from the opto-electrical transmitter;
a converter connected to convert the analog signal from the monitor diode to a digital signal;
a digital feedback loop connected to the converter and the output driver, wherein the digital feedback loop that maintains a digital value that controls a level of the bias current during transmissions by the opto-electrical transmitter; and
a fault activation circuit that activates a fault signal in response to the digital value reaching a level indicating a fault.

22. The driver circuit of claim 21, wherein the digital feedback loop comprises a counter connected to increment the digital value in response to a clock signal when a value of the digital signal from the converter is greater than a calibration value and to decrement the digital value in response to the clock signal when the value of the digital signal is less than the calibration value.

23. The driver circuit of claim 22, where in the digital feedback loop further comprises a memory that stores the calibration value, wherein the memory is accessible for writing of the calibration value during a calibration process for the opto-electrical transmitter.

* * * * *